United States Patent [19]

Anthony et al.

[11] 4,032,955
[45] June 28, 1977

[54] DEEP DIODE TRANSISTOR

[75] Inventors: Thomas R. Anthony; Harvey E. Cline, both of Schenectady, N.Y.

[73] Assignee: General Electric Company, Schenectady, N.Y.

[22] Filed: Aug. 9, 1976

[21] Appl. No.: 712,716

[52] U.S. Cl. .................................. 357/34; 357/35; 357/37; 357/60; 357/88; 357/89; 357/90
[51] Int. Cl.² ................. H01L 29/72; H01L 29/00; H01L 29/04
[58] Field of Search .................. 357/34, 35, 37, 60, 357/88, 89, 90

[56] References Cited

UNITED STATES PATENTS 2,813,048  11/1957  Pfann .................................. 357/60

Primary Examiner—Edward J. Wojciechowicz
Attorney, Agent, or Firm—Donald M. Winegar; Joseph T. Cohen; Jerome C. Squillaro

[57] ABSTRACT

A deep diode transistor includes at least one of the emitter, the collector and the base regions comprising recrystallized material of the semiconductor substrate embodying the transistor. Each region of recrystallized material is formed in situ by the migration of a melt of a metal-rich semiconductor material through the material of the substrate at a predetermined elevated temperature along a thermal gradient established in the substrate.

24 Claims, 6 Drawing Figures

DEEP DIODE TRANSISTOR

BACKGROUND OF THE INVENTION

1. Field of the Invention

This invention relates to semiconductor transistors and, in particular, to the structure of one or more regions formed in situ by thermal gradient zone melting.

2. Description of the Prior Art

Heretofore, transistors for use in integrated and other electrical circuits are manufactured by processes embodying alloying, diffusion and epitaxial growth techniques. These techniques of processing inherently limits the physical characteristics and physical dimensions of the transistor manufactured thereby.

An object of this invention is to provide a new and improved semiconductor transistor which overcomes the deficiencies of the prior art.

Another object of this invention is to provide a new and improved semiconductor transistor having a lamellar structure and wherein selected regions of the transistor are formed in situ from recrystallized material of the material of the substrate.

Other objects of this invention will, in part, be obvious and will, in part appear hereinafter.

BRIEF DESCRIPTION OF THE INVENTION

In accordance with the teachings of this invention, there is provided a semiconductor transistor comprising a body of semiconductor material having two opposed major surfaces forming, respectively, the top and bottom surfaces of the body. The semiconductor material has a predetermined level of resistivity, a predetermined first type conductivity, and a preferred crystal structure. The body has a vertical axis which is substantially perpendicular to the opposed major surfaces and aligned substantially parallel with a first preferred crystal axis of the material of the body. At least one of the opposed major surfaces has a predetermined crystal planar orientation which is one selected from the group consisting of (100), (110) and (111).

The body is divided into at least three integral planar-like regions of alternate and opposite type conductivity. These regions are substantially perpendicular to the opposed major surfaces and form, respectively, the collector, the base and the emitter regions of the transistor.

At least one of the planar-like regions comprises recrystallized semiconductor material of the body and has predetermined type conductivity and a predetermined level of resistivity. The planar-like region is oriented within the body so as to be aligned substantially parallel with a second preferred crystal axis of the material of the body. Each of the planar-like regions extends between, and terminates in, the opposed major surfaces of the body and is aligned substantially parallel with the vertical axis of the body. Each planar-like region also has opposed end surfaces each of which is coextensive with a respective one of the opposed major surfaces.

Each planar-like region of recrystallized material is formed in situ by the migration of a melt of metal-rich semi-conductor material of the body through the solid material of the body by thermal gradient zone melting. The migration of the melt is practiced at a predetermined elevated temperature along a thermal gradient established in the body substantially parallel with the first preferred crystal axis and the vertical axis of the body. The recrystallized material has a predetermined level of concentration of the metal of the melt therein as determined by the solid solubility limit of that metal in that semiconductor material at that predetermined elevated temperature of migration. The metal is distributed substantially uniformly throughout the entire region. The metal also consists of at least one dopant impurity metal to impart a predetermined type conductivity and desired level of resistivity to the recrystallized material of the planar region. The conductivity type may be the same as, or different from, that of the material of the body.

A P-N junction is formed by the abutting contiguous surfaces of the material of each pair of adjacent regions of opposite type conductivity. Each P-N junction so formed is substantially perpendicular to and exposed at the major opposed surface of the body.

DESCRIPTION OF THE INVENTION

Figure 1:
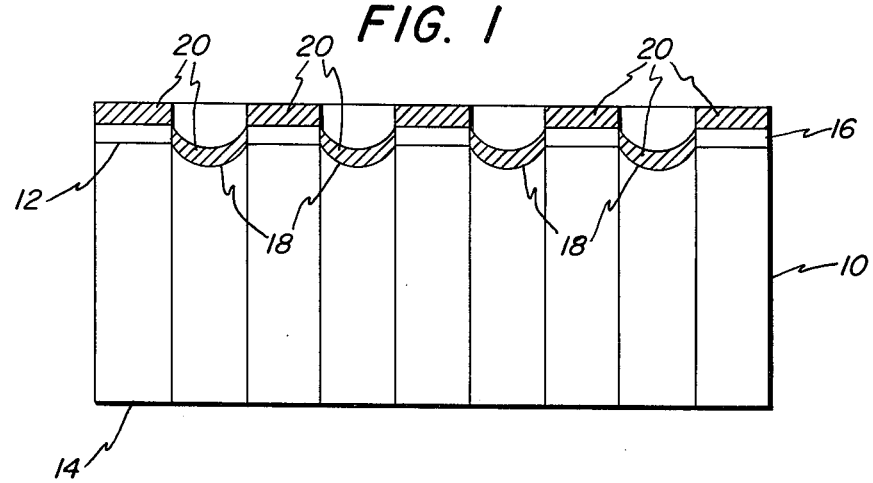
FIGS. 1 through 5 are side elevation views, partly in cross-section, of a body of semiconductor material processed in accordance with the teachings of this invention to produce a transistor.

With reference to FIG. 1, there is shown a body 10 semiconductor material having a selected resistivity and a first type conductivity. The body 10 has two opposed major surfaces 12 and 14 which are the top and bottom surfaces respectively thereof. The semiconductor material comprising the body 10 may be silicon, germanium, silicon carbide, gallium arsenide, a compound of a Group II element and a Group VI element, and a compound of a Group III element and a Group V element.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80° C. A suitable mask of spaced lines of a predetermined thickness and spaced a predetermined distance apart, is disposed on the layer of photoresist and exposed to ultraviolet light. After exposure, the layer of photoresist is washed in xylene, to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$—HF). The etching is continued until a second set of windows corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a solution of 1 part of hydrogen peroxide and 1 part of concentrated sulphuric acid immediately after mixing.

Selective etching of the exposed surface areas of body 10 is accomplished with a mixed acid solution. The mixed acid solution is 10 parts by volume nitric acid 70 percent, four parts by volume acetic acid, 100 percent, and one part by volume hydrofluoric acid 48 percent. At a temperature of from 20° to 30° C, the mixed acid solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25° C will result in a trough 18 of from 25 to 30 microns in depth for a window width of 10 to 500 microns. The etched body 10 is rinsed in distilled water and blown dry. Preferably, a gas such, for example, as freon, argon and the like is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by one or more materials to impart a second and opposite type conductivity to the material of the body 10 through which it migrates. The thickness of the layer 20 is approximately equal to the depth of the trough 18. Therefore, if the trough 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding away the excess metal with a 600 grit carbide paper.

It has been discovered that the vapor deposition of the layer 20 of aluminum metal should be performed at a pressure of approximately $1 \times 10^{-5}$ torr but not greater than $5 \times 10^{-5}$ torr. When the pressure is greater than $3 \times 10^{-5}$ torr we have found that in the case of aluminum metal deposited in the troughs 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum appears to be saturated with oxygen from the process. The preferred methods of depositing aluminum on the silicon body 10 are by the electron beam method and the like wherein little if any oxygen can be trapped in the aluminum.

The processed body 10 is placed in a migration apparatus, not shown, and the metal wires in the troughs 18 are migrated through the body 10 by a thermal gradient zone melting process. A thermal gradient of approximately 50° C per centimeter between the bottom surface 14, which is the hot face, and the surface 12, which is the cold face, has been discovered to be appropriate for an average temperature of the body 10 of from 700° to 1350° C. The process is practiced for a sufficient length of time to migrate all the metal wires through the body 10. For example, for aluminum wires of 20 microns thickness, a thermal gradient of 50° C per centimeter, a temperature of the body 10 of 1100° C, a pressure of $1 \times 10^{-5}$ torr, a furnace time of less than 12 hours is required to migrate the wires through a silicon body 10 of 1 centimeter thickness.

The temperature gradient zone melting process and apparatus is not a part of this invention. For a more thorough understanding of the temperature gradient zone melting process employed in this invention and for a more thorough description of the apparatus employed for the process, one is directed to our following patents or copending applications which are assigned to the same assignee of this invention: Method of Making Deep Diode Devices, U.S. Pat. No. 3,901,736; Deep Diode Device Production and Method, U.S. Pat. No. 3,910,801; Deep Diode Devices and Method and Apparatus, Ser. No. 411,001, now abandoned in favor of Ser. No. 552,154; High Velocity Thermomigration Method of Making Deep Diodes, U.S. Pat. No. 3,898,106; Deep Diode Device Having Dislocation-Free P-N Junctions and Method, U.S. Pat. No. 3,902,925; and The Stabilized Droplet Method of Making Deep Diodes Having Uniform Electrical Properties, U.S. Pat. No. 3,899,361.

Figure 2:
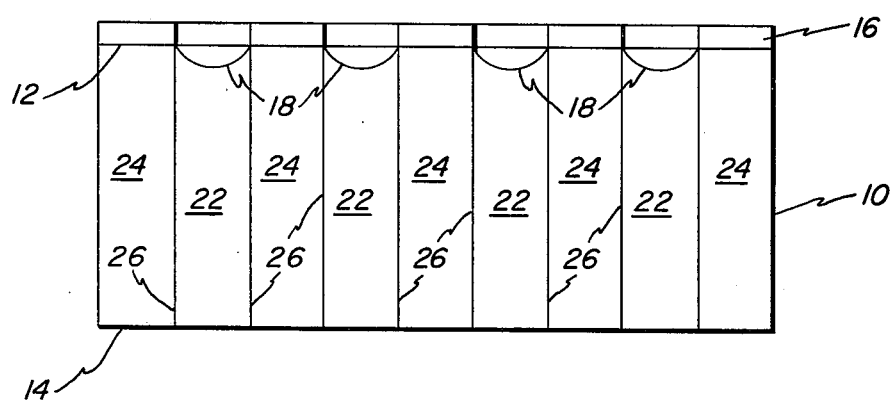

Upon completion of the temperature gradient zone melting process the excess metal of the thermomigrated metal wires is removed from the surface 14 preferably by selective etching. The surfaces 12 and 14 are selectively etched and polished and the resulting processed body 10 is as shown in FIG. 2. The thermal migration of the metal wires in the troughs 18 through the body 10 produces a body 10 having a plurality of first spaced regions 22 of a second and opposite type conductivity than the body 10. Each region 22 is recrystallized material of the body 10 having solid solubility of the metal therein of a concentration sufficient to obtain the desired conductivity. The region 22 has a substantially constant uniform level of impurity concentration throughout the entire planar region as the temperature gradient in the body and the slope of the solid solubility of metals employed is such as not to appreciably affect material composition. The thickness of the region 22 is substantially constant for the entire region. The peripheral surface of each planar region 22 comprises in part the top surface 12, the bottom surface 14 and the peripheral surface of the body 10.

Additionally, the body 10 is divided into a plurality of spaced regions 24 having the same, or first, type conductivity as the body 10. A P-N junction is formed by the contiguous surfaces of each pair of mutually adjacent regions 22 and 24 of opposite type conductivity. The P-N junction 26, as formed, is very abrupt and distinct resulting in a step junction. Each P-N junction 26 is approximately 18 microns in thickness. At a process temperature of 900° C, the P-N junction 26 profile is reduced to approximately 0.3 microns.

Figure 3:
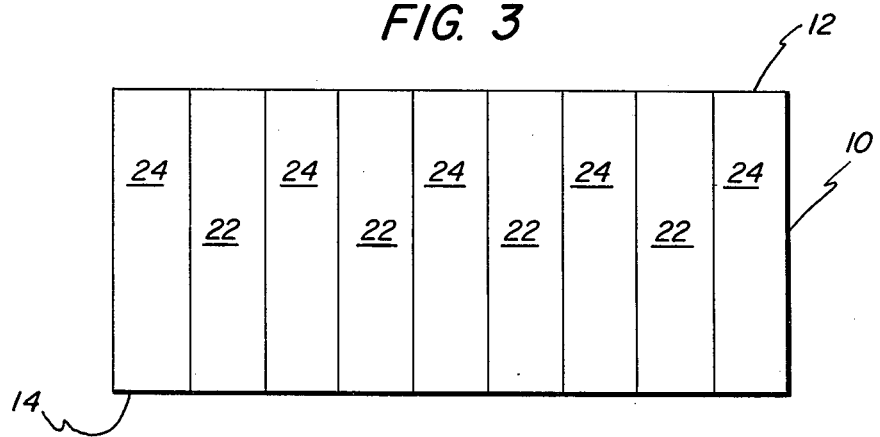

The resulting structure is one large lamellar body of a plurality of planar regions of alternate type conductivity as shown in FIG. 3. The structure may also be divided into a plurality of chips having a similar configuration.

Figure 4:
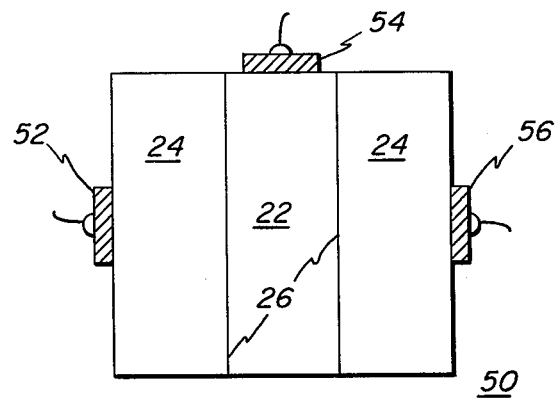
Figure 5:
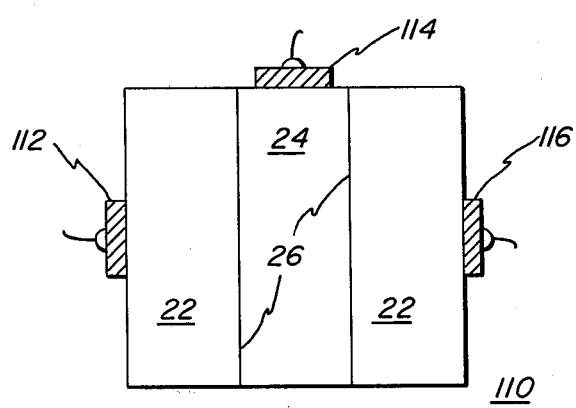

Referring now to FIGS. 4 and 5, there is shown, respectively, an N-P-N semiconductor transistor 50 and P-N-P semiconductor transistor 110 made from the processed body 10 of FIG. 3. Each transistor 50 and 110 has a lamellar structure of at least three regions 24, 22 and 24 in one for the former and regions 22, 24 and 26 in the latter transistor. For transistor 50, an ohmic electrical contact 52 is affixed to the first N-type region 24, an ohmic electrical contact 54 is affixed to the P-type region 22, and an ohmic electrical contact 56 is affixed to the second N-type region 22. For transistor 110 an ohmic electrical contact 112 is affixed to the first N-type region 22, an ohmic electrical contact 114 is affixed to the P-type region 24 and an ohmic electrical contact 116 is affixed to the second P-type region 22. In either instance the configuration and electrical contact arrangement enable the transistors 50 and 110 to be connected into electrical circuit arrangements and to function as transistors as required.

As required, the planar regions 22 and 24 may have a level of resistivity different from that of the material of other corresponding regions of the same type conductivity. This is achieved by temperature gradient zone melting process wherein the metal layer 20 comprises a material suitable for doping the material of either region 22 or 24 or the body 10 to produce semiconductor material of the desired type conductivity and level of resistivity. The desired level of resistivity of regions may also be achieved by practicing thermal gradient zone melting at the elevated temperature range which will result in the solid solubility limit of the material migrated in that particular semiconductor material as determined by the appropriate phase diagram.

Figure 6:
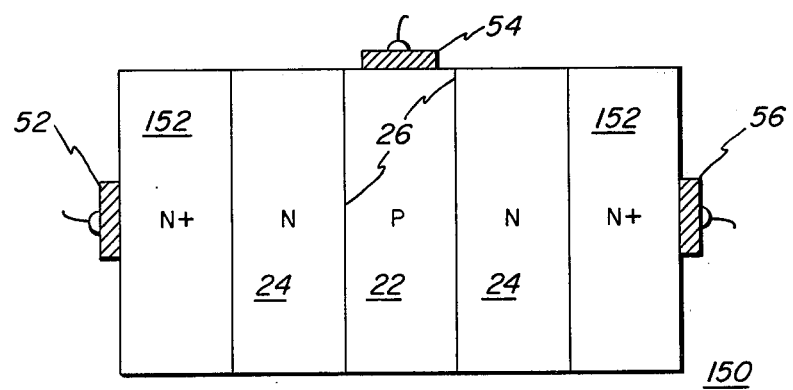
FIG. 6 is a side elevation view, partly in cross-section, of an alternate embodiment of the transistor of FIG. 4.

By employing the technique described, the transistor 150 can be produced with the structure as shown in FIG. 6. The transistor 150 is an alternate embodiment of the transistor 50. All items denoted by the same reference numerals in both FIGS. 4 and 6, are the same, and function in the same manner, as described heretofore. Regions 152 and 154 of $N^+$-type conductivity have been formed by thermal gradient zone melting to enhance the electrical connecting of contacts 52 and 56 to the respective N-type regions 24.

Figure 7:
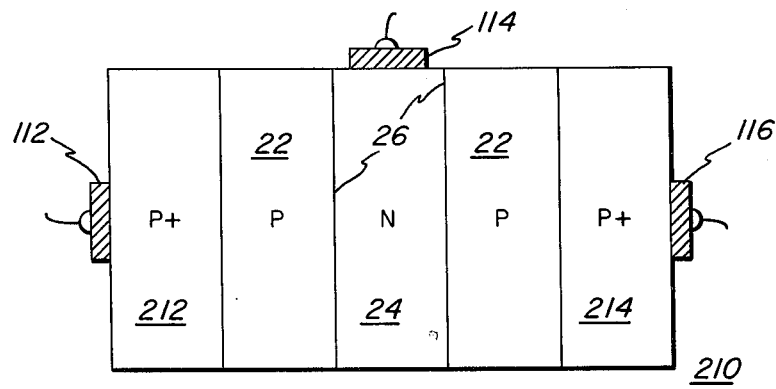
FIG. 7 is a side elevation view, partly in cross-section, of an alternate embodiment of the transistor of FIG. 5.

Referring now to FIG. 7, there is shown a transistor 210 which is an alternate embodiment of the transistor 110. The reference numerals in FIG. 7 denote items which are the same as, and function in the same manner as, the same items previously described in FIG. 5. Thermal gradient zone melting is practiced to produced regions 212 and 214, each of $P^+$-type conductivity, to enhance the functioning of electrical contacts 112 and 116 to the respective P-type regions 22.

Figure 8:
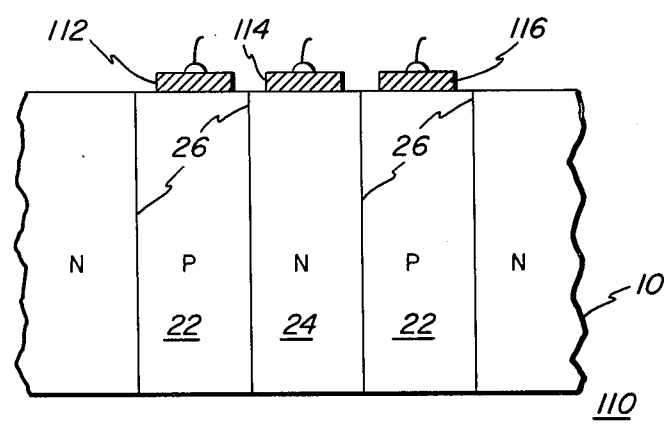
FIG. 8 is a side elevation view, partly in cross-section, of an alternate embodiment of the transistor of FIG. 1.

With reference to FIG. 8, there is shown an arrangement of the transistor 110 functioning as a planar transistor in an integrated circuit. The transistor 110 is formed in the same manner as before in a portion of the body 10. Electrical contacts 112, 114 and 116 are affixed to a portion of the surface 12 in which the respective regions 22 and 24 are exposed and are coextensive therewith. Other type solid state devices may form in the remaining portion of the material of the body 10 and connections therebetween made as required.

Since the width of the base region of a transistor determines the gain of the device, one may easily practice the method of this invention and design his regions 22 and 24 accordingly. Lateral diffusion of the P-N junctions can be achieved by further heat treating of the processed body.

Other geometrical configurations such as concentric regions of planar rectangular configuration and/or concentric cylindrical configurations may be employed in fabricating transistors of this invention.

As an example of the teachings of this invention, a P-N-P transistor was produced by first slicing a 1 cm thick wafer from a 2.5 cm diameter 10 ohm-cm (111) orientation Lopex silicon supplied by Texas Instruments Corporation. The ingot was phosphorous doped and had a minority carrier lifetime of greather than 50 nano-sec. The wafer was polished and oxidized in wet $O_2$ at 1000° C for 16 hours. Next, the wafer was patterned with Kodak Metal Etch Resist with a plurality of lines. The oxide was selectively etched in a buffered hydrofluoric acid solution ($NH_4F$—HF). The etching was continued 30 minutes until windows in the oxide were removed. The processed body was rinsed in deionized water and dried.

Selective etching of the exposed silicon surface of the body was accomplished with a mixed acid solution. The mixed acid solution comprised 10 parts by volume nitric acid, 70 percent, four parts by volume acetic acid, 100 percent, and one part by volume hydrofluoric acid, 48 percent. At a temperature of from 20° to 30° C, the mixed acid solution selectively etched the silicon body 30 at a rate of approximately 5 microns per minute. A plurality of troughs were etched 20 microns deep into the body of semiconductor material. The etched body was rinsed in distilled water and blown dry with dry nitrogen.

The processed body was placed in an evaporation chamber and a 20 micron thick layer of aluminum metal was deposited into the troughs and onto the oxide layer. Excess aluminum was removed by 600 grit SiC metallographic paper.

The body was placed in a thermal migration apparatus and heated to 1120° C with a thermal gradient of 50° C/cm in the ambient atmosphere of the room.

Upon completion of the temperature gradient zone melting process, the aluminum wires had migrated through the body onto the bottom surface and were removed by grinding.

A rectangular sample 1 mm × 4 mm × 25 mm was cut with a diamond wheel from the processed body and polished on 600 grit carbide metallographic paper. The surface damage was removed with a solution of 10 HF and 30 $HNO_3$ by volume.

Figure 9:
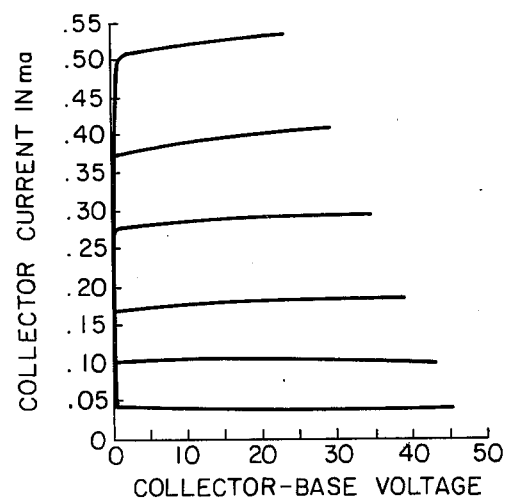
FIG. 9 is a graph of the common emitter characteristic of a P-N-P transistor made in accordance with the teachings of this invention.

Examination of the sample under the microscope showed a P-N-P sandwich in which the distance between the two P-type regions was 138 $\mu$. A probe station and curve tracer was employed to determine the common base characteristics shown in FIG. 9. The transistor breaks down at 360 volts and the efficiency was determined to be 0.43. The injection efficiency was nearly unity since the dopant in the P-type emitter was $2 \times 10^{19}$ carriers/$cm^3$ and is much greater than the dopant in the N-type base which was $4 \times 10^{14}$ carriers/$cm^3$. The minority carrier lifetime in this transistor was calculated to be 20 $\mu$ sec. from date obtained and demonstrated the cleanliness of the process although not practiced in a clean room atmosphere.

We claim as our invention:

1. A semiconductor transistor comprising
   a body of semiconductor material having two opposed major surfaces forming respectively the top and bottom surfaces of the body, a predetermined level of resistivity, a predetermined first type conductivity, a preferred crystal structure and a vertical axis substantially perpendicular to the major opposed surfaces and aligned substantially parallel with a first preferred crystal axis of the material of the body;
   at least one of the opposed major surfaces having a predetermined crystal planar orientation which is one selected from the group consisting of (100), (110) and (111);
   at least three integral planar-like regions of alternate and opposite type conductivity formed in the body to form, respectively, the collector, the base, and the emitter regions of the transistor;
   at least one of the planar-like regions comprising recrystallized semiconductor material of the body having a predetermined type conductivity and a predetermined level of resistivity and so oriented within the body as to be aligned with a second preferred crystal axis of the material of the body;
   each of the planar-like regions extending between, and terminating in, the opposed major surfaces of the body, the region having a vertical aligned substantially parallel with the vertical axis of the body and opposed end surfaces, each of which is coextensive with a respective one of the opposed major surfaces;
   the recrystallized material is formed in situ by the migration of a melt of metal-rich semiconductor material of the body through the material of the body by thermal gradient zone melting at a predetermined elevated temperature along a thermal gradient substantially parallel with the first preferred crystal axis and the vertical axis of the body and has a predetermined level of concentration of the metal of the melt as determined by the solid solubility limit of that metal in that semiconductor material at that predetermined elevated temperature of migration and the metal is distributed substantially uniformly throughout the entire region;
   the metal consisting of at least one dopant impurity material to impart the type conductivity and level of resistivity to the planar region;
   a P-N junction formed by the abutting, contiguous surfaces of the material of each of the planar regions and the material of the body, and
   each P-N junction being substantially perpendicular to, and exposed at, the major opposed surfaces of the body.

2. The semiconductor transistor of claim 1 wherein the semiconductor material is one selected from the group consisting of silicon, silicon carbide, germanium and gallium arsenide.

3. The semiconductor transistor of claim 2 wherein the material of the body is silicon of N-type conductivity, and
   the recrystallized material has P-type conductivity and
   the dopant impurity material in the recrystallized silicon is aluminum.

4. The semiconductor transistor of claim 1 wherein the preferred planar crystal orientation is (111), and the first crystal axis is $<111>$.

5. The semiconductor transistor of claim 4 wherein the material of the body is one selected from the group consisting of silicon, silicon carbide, germanium and gallium arsenide.

6. The semiconductor transistor of claim 5 wherein the material of the body is silicon of N-type conductivity, and
   the dopant impurity material is aluminum.

7. The semiconductor transistor of claim 4 wherein the second crystal axis is one selected from the group consisting of $<01\bar{1}>$, $<10\bar{1}>$, $<1\bar{1}0>$, $<11\bar{2}>$, $<\bar{2}11>$, and $<1\bar{2}1>$.

8. The semiconductor transistor of claim 7 wherein the material of the body is one selected from the group consisting of silicon, silicon carbide, germanium and gallium arsenide.

9. The semiconductor transistor of claim 8 wherein the material of the body is silicon of N-type conductivity, and
   the dopant impurity material is aluminum.

10. The semiconductor transistor of claim 1 wherein the preferred planar crystal orientation is (100), and the first crystal axis is $<100>$.

11. The semiconductor transistor of claim 10 wherein
    the material of the body is one selected from the group consisting of silicon, silicon carbide, germanium and gallium arsenide.

12. The semiconductor transistor of claim 11 wherein
    the material of the body is silicon of N-type conductivity, and
    the dopant impurity material is aluminum.

13. The semiconductor transistor of claim 10 wherein
    the second crystal axis is one selected from the group consisting of $<011>$ and $<0\bar{1}1>$.

14. The semiconductor transistor of claim 13 wherein
    the material of the body is one selected from the group consisting of silicon, silicon carbide, germanium and gallium arsenide.

15. The semiconductor transistor of claim 14 wherein
    the material of the body is silicon of N-type conductivity, and
    the dopant impurity material is aluminum.

16. The semiconductor transistor of claim 1 wherein the preferred planar crystal orientation is (110), and the first crystal axis is $<110>$.

17. The semiconductor transistor of claim 16 wherein
    the material of the body is one selected from the group consisting of silicon, silicon carbide, germanium and gallium arsenide.

18. The semiconductor of claim 17 wherein
    the material of the body is silicon of N-type conductivity, and
    the dopant impurity material is aluminum.

19. The semiconductor transistor of claim 16 wherein
    the second crystal axis is $<1\bar{1}0>$.

20. The semiconductor transistor of claim 19 wherein the material of the body is one selected from the group consisting of silicon, silicon carbide, germanium and gallium arsenide.

21. The semiconductor transistor of claim 20 wherein
the material of the body is silicon of N-type conductivity, and
the dopant impurity material is aluminum.

22. The semiconductor transistor of claim 1 wherein
at least two of the regions of the transistor consists in part of recrystallized semiconductor material of the body, at least one of the regions has the same type conductivity as that of the body and the predetermined level of resistivity is different from that of the body.

23. The semiconductor transistor of claim 1 wherein
the transistor is one of a plurality of semiconductor devices formed in the body of semiconductor material.

24. The semiconductor transistor of claim 22 wherein
the transistor is one of a plurality of semiconductor devices formed in the body of semiconductor material.

* * * * *